(12) United States Patent
Wieting et al.

(10) Patent No.: US 8,241,943 B1
(45) Date of Patent: Aug. 14, 2012

(54) SODIUM DOPING METHOD AND SYSTEM FOR SHAPED CIGS/CIS BASED THIN FILM SOLAR CELLS

(75) Inventors: Robert D. Wieting, Simi Valley, CA (US); Steven Aragon, Campbell, CA (US); Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 265 days.

(21) Appl. No.: 12/774,675

(22) Filed: May 5, 2010

Related U.S. Application Data

(60) Provisional application No. 61/176,857, filed on May 8, 2009.

(51) Int. Cl.
*H01L 21/00* (2006.01)
*H01L 31/00* (2006.01)

(52) U.S. Cl. ............... 438/95; 257/E21.04; 136/262; 136/264; 136/265; 438/84; 438/930

(58) Field of Classification Search .............. 438/95; 257/E21.04, E31.027; 136/262, 264, 265
See application file for complete search history.

(56) References Cited

U.S. PATENT DOCUMENTS

| | | | |
|---|---|---|---|
| 4,204,933 A | 5/1980 | Barlow et al. |
| 4,213,781 A | 7/1980 | Noreika et al. |
| 4,239,553 A | 12/1980 | Barnett et al. |
| 4,347,436 A | 8/1982 | Fukuda et al. |
| 4,502,225 A | 3/1985 | Lin |
| 4,611,091 A | 9/1986 | Choudary et al. |
| 4,612,411 A | 9/1986 | Wieting et al. |
| 4,873,118 A | 10/1989 | Elias et al. |
| 4,915,745 A | 4/1990 | Pollock et al. |
| 4,996,108 A | 2/1991 | Divigalpitiya et al. |
| 5,125,984 A | 6/1992 | Kruehler et al. |
| 5,261,968 A | 11/1993 | Jordan |
| 5,421,909 A | 6/1995 | Ishikawa et al. |
| 5,482,571 A | 1/1996 | Yamada et al. |
| 5,501,744 A | 3/1996 | Albright et al. |
| 5,536,333 A | 7/1996 | Foote et al. |
| 5,578,103 A | 11/1996 | Araujo et al. |
| 5,589,006 A | 12/1996 | Itoyama et al. |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Leonard Chang
(74) *Attorney, Agent, or Firm* — Kilpatrick Townsend & Stockton LLP

(57) ABSTRACT

A method of sodium doping in fabricating CIGS/CIS based thin film solar cells includes providing a shaped substrate member. The method includes forming a barrier layer over the surface region followed by a first electrode layer, and then a sodium bearing layer. A precursor layer of copper, indium, and/or gallium materials having an atomic ratio of copper/group III species no greater than 1.0 is deposited over the sodium bearing layer. The method further includes transferring the shaped substrate member to a second chamber and subjecting it to a thermal treatment process within an environment comprising gas-phase selenium species, followed by an environment comprising gas-phase sulfur species with the selenium species being substantially removed to form an absorber layer.

29 Claims, 6 Drawing Sheets

U.S. PATENT DOCUMENTS

| | | | |
|---|---|---|---|
| 5,622,634 | A | 4/1997 | Noma et al. |
| 5,626,688 | A | 5/1997 | Probst et al. |
| 5,665,175 | A | 9/1997 | Safir |
| 5,855,974 | A | 1/1999 | Wu et al. |
| 5,948,176 | A | 9/1999 | Ramanathan et al. |
| 5,985,691 | A | 11/1999 | Basol et al. |
| 6,001,744 | A | 12/1999 | Doi |
| 6,077,722 | A | 6/2000 | Jansen et al. |
| 6,134,049 | A | 10/2000 | Spiller et al. |
| 6,169,246 | B1 | 1/2001 | Wu et al. |
| 6,258,620 | B1 | 7/2001 | Morel et al. |
| 6,288,325 | B1 | 9/2001 | Jansen et al. |
| 6,310,281 | B1 | 10/2001 | Wendt et al. |
| 6,328,871 | B1 | 12/2001 | Ding et al. |
| 6,335,479 | B1 | 1/2002 | Yamada et al. |
| 6,361,718 | B1 | 3/2002 | Shinmo et al. |
| 6,380,480 | B1 | 4/2002 | Norimatsu et al. |
| 6,423,565 | B1 | 7/2002 | Barth et al. |
| 6,537,845 | B1 | 3/2003 | McCandless et al. |
| 6,632,113 | B1 | 10/2003 | Noma et al. |
| 6,635,307 | B2 | 10/2003 | Huang et al. |
| 7,179,677 | B2 | 2/2007 | Ramanathan et al. |
| 7,220,321 | B2 | 5/2007 | Barth et al. |
| 7,235,736 | B1 | 6/2007 | Buller et al. |
| 7,252,923 | B2 | 8/2007 | Kobayashi |
| 7,303,788 | B2 | 12/2007 | Kataoka et al. |
| 7,319,190 | B2 | 1/2008 | Tuttle |
| 7,364,808 | B2 | 4/2008 | Sato et al. |
| 7,544,884 | B2 | 6/2009 | Hollars |
| 7,576,017 | B2 | 8/2009 | Tuttle |
| 7,632,701 | B2 * | 12/2009 | Dhere et al. ............. 438/84 |
| 7,736,755 | B2 | 6/2010 | Igarashi et al. |
| 7,741,560 | B2 | 6/2010 | Yonezawa |
| 7,846,750 | B2 | 12/2010 | Boyer |
| 7,863,518 | B2 | 1/2011 | Terakawa et al. |
| 7,875,945 | B2 | 1/2011 | Krasnov et al. |
| 2002/0004302 | A1 | 1/2002 | Fukumoto et al. |
| 2002/0061361 | A1 | 5/2002 | Nakahara et al. |
| 2004/0191949 | A1 | 9/2004 | Iwata et al. |
| 2004/0191950 | A1 | 9/2004 | Nakamura et al. |
| 2005/0109392 | A1 | 5/2005 | Hollars |
| 2005/0223570 | A1 | 10/2005 | Yonezawa et al. |
| 2006/0219288 | A1 | 10/2006 | Tuttle |
| 2006/0220059 | A1 | 10/2006 | Satoh et al. |
| 2007/0004078 | A1 | 1/2007 | Alberts |
| 2007/0089782 | A1 | 4/2007 | Scheuten et al. |
| 2007/0116892 | A1 | 5/2007 | Zwaap et al. |
| 2007/0151596 | A1 | 7/2007 | Nasuno et al. |
| 2007/0169810 | A1 | 7/2007 | Van Duren et al. |
| 2007/0209700 | A1 | 9/2007 | Yonezawa et al. |
| 2007/0243657 | A1 | 10/2007 | Basol et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0110491 | A1 | 5/2008 | Buller et al. |
| 2008/0115827 | A1 | 5/2008 | Woods et al. |
| 2008/0121277 | A1 | 5/2008 | Robinson et al. |
| 2008/0210303 | A1 | 9/2008 | Lu et al. |
| 2008/0216886 | A1 | 9/2008 | Iwakura |
| 2009/0021157 | A1 | 1/2009 | Kim et al. |
| 2009/0084438 | A1 | 4/2009 | den Boer et al. |
| 2009/0087942 | A1 | 4/2009 | Meyers |
| 2009/0145746 | A1 | 6/2009 | Hollars |
| 2009/0235983 | A1 | 9/2009 | Girt et al. |
| 2009/0235987 | A1 | 9/2009 | Akhtar et al. |
| 2009/0293945 | A1 | 12/2009 | Peter |
| 2010/0087016 | A1 | 4/2010 | Britt et al. |
| 2010/0087026 | A1 | 4/2010 | Winkeler et al. |
| 2010/0087027 | A1 | 4/2010 | Wieting |
| 2010/0096007 | A1 | 4/2010 | Mattmann et al. |
| 2010/0101648 | A1 | 4/2010 | Morooka et al. |
| 2010/0101649 | A1 | 4/2010 | Huignard et al. |
| 2010/0212732 | A1 * | 8/2010 | Schmidt et al. ............. 136/256 |
| 2010/0224247 | A1 | 9/2010 | Bartholomeusz et al. |
| 2010/0267189 | A1 | 10/2010 | Yu et al. |
| 2010/0297798 | A1 | 11/2010 | Adriani et al. |

OTHER PUBLICATIONS

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

* cited by examiner

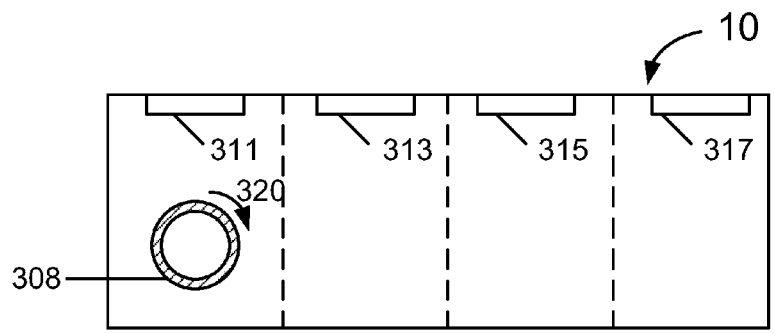
Fig. 3
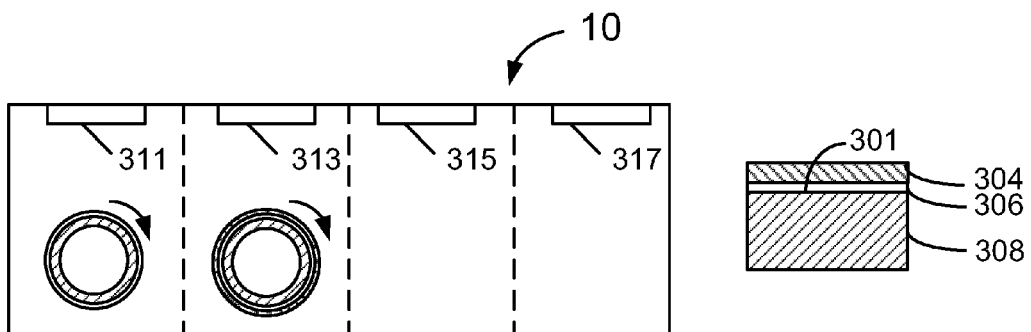
Fig. 4
Fig. 4A
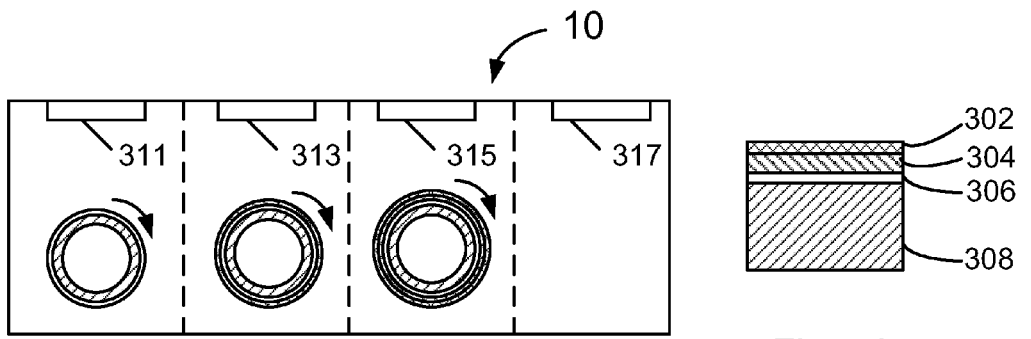
Fig. 5
Fig. 5A

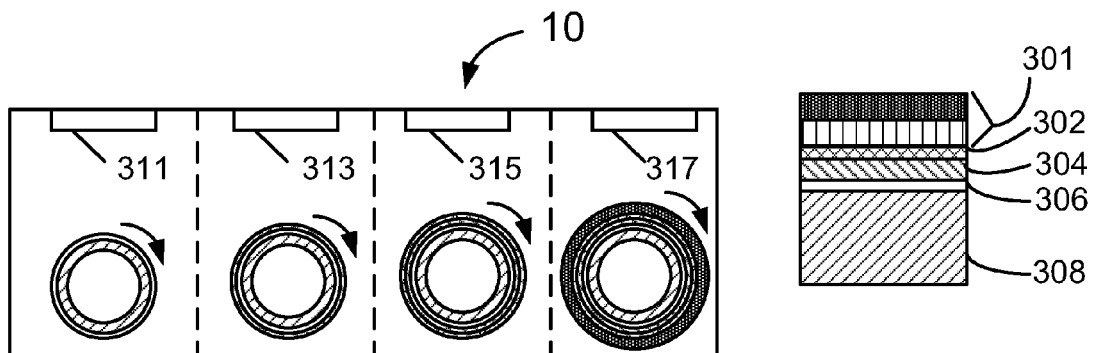
Fig. 6
Fig. 6A
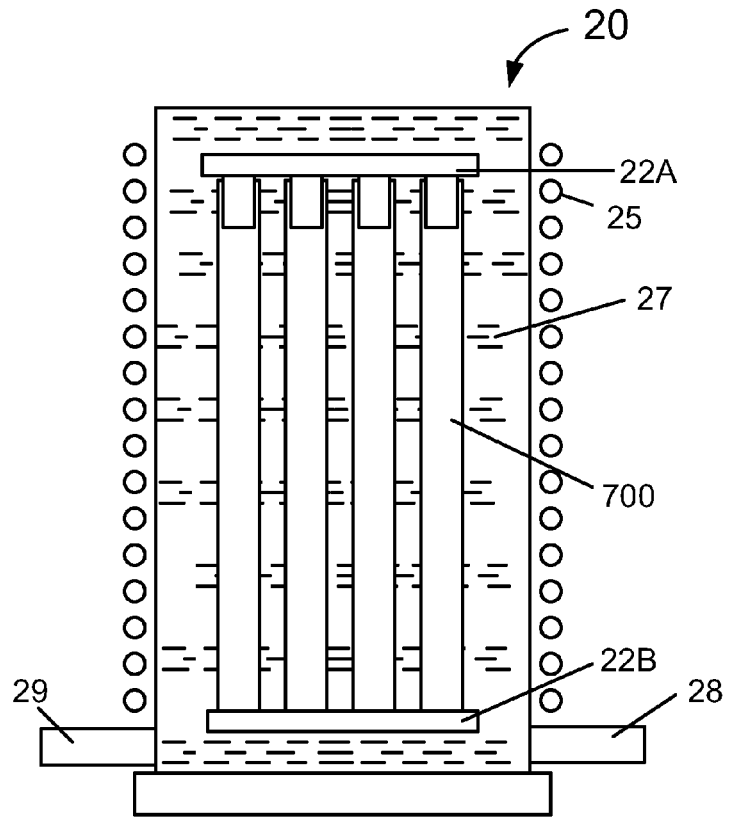
Fig. 7

SODIUM DOPING METHOD AND SYSTEM FOR SHAPED CIGS/CIS BASED THIN FILM SOLAR CELLS

CROSS-REFERENCE TO RELATED APPLICATION

This application claims priority to U.S. Provisional Patent Application No. 61/176,857, filed May 8, 2009, entitled "SODIUM DOPING METHOD AND SYSTEM FOR SHAPED CIGS/CIS BASED THIN FILM SOLAR CELLS" by inventors Robert D Wieting, Steven Aragon, and Chester A. Farris III., commonly assigned and incorporated by reference herein for all purposes.

BACKGROUND OF THE INVENTION

This invention relates generally to photovoltaic techniques. More particularly, embodiments of the present invention provide a method and system for sodium doping in fabricating a copper indium diselenide species (CIS), copper indium gallium diselenide species (CIGS) based thin film photovoltaic cell, as well as other types of cells. The invention can be applied to various shaped cells including cylindrical/tubular photovoltaic modules, non-planar surfaces, flexible sheets, plastics, building or window glass, roof tiles, automobiles, and others.

In the process of manufacturing CIS and/or CIGS types of thin films, there are various manufacturing challenges, such as maintaining structure integrity of substrate materials, ensuring uniformity and granularity of the thin film material, etc. While conventional techniques in the past have addressed some of these issues, they are often inadequate in various situations. Therefore, it is desirable to have improved systems and methods for manufacturing thin film photovoltaic devices.

BRIEF SUMMARY OF THE INVENTION

The present invention relates generally to photovoltaic techniques. More particularly, embodiments of the present invention provide a method and system for sodium doping in fabricating a copper indium diselenide species (CIS), copper indium gallium diselenide species (CIGS) based thin film photovoltaic cell, and/or others. The invention can be applied to various shaped cells including cylindrical/tubular photovoltaic modules, non-planar surfaces, flexible sheets, plastics, building or window glass, roof tiles, automobiles, and others.

In a specific embodiment, the present invention provides a method of sodium doping in fabricating CIGS/CIS based thin film solar cells. The method includes providing a shaped substrate member in a first chamber comprising one or more targets. The shaped substrate member is characterized by a spatial form selected from a cylinder, a tube, a sphere, a non-planar, a flexible foil, and a plastic or polymer and other combinations. The shaped substrate member has a surface region bearing a shape of the spatial form and is configured through one or more mechanical motions to allow the surface region being fully exposed to the one or more targets. The method further includes forming a barrier layer overlying the surface region of the shaped substrate member and forming a first electrode layer overlying the barrier layer. Additionally, the method includes sputtering a sodium bearing layer overlying the first electrode layer from a sodium or sodium compound target. The sodium bearing layer comprises a first amount of sodium species. The method further includes forming one or more precursor layers overlying the sodium bearing layer, the one or more precursor layers comprising at least a copper or copper-gallium layer followed by an indium layer, wherein a content ratio of copper/group III species being substantially equal to and smaller than 1.0. Furthermore, the method includes loading the shaped substrate member including the first electrode layer, the sodium bearing layer, and the one or more precursor layers, into a second chamber. Moreover, the method includes subjecting the shaped substrate member to a thermal treatment process in the second chamber within an environment comprising gas-phase selenium species followed by an environment comprising gas-phase sulfur species with selenium species being substantially removed to form an absorber layer.

In another specific embodiment, the present invention provides a method of sodium doping for fabricating CIGS/CIS solar cells. The method includes providing a shaped substrate member in a first chamber comprising one or more targets. The shaped substrate member comprises a surface region in a spatial form and is configured through one or more mechanical motions to allow the surface region being fully exposed to the one or more targets. The method further includes forming a barrier layer overlying the surface region and forming, using a sputtering process, a first electrode layer overlying the barrier layer from at least one target of the one or more targets. The at least one target comprises molybdenum species. Additionally, the method includes forming, using a sputtering process, a sodium bearing layer overlying the first electrode layer from at least another target of the one or more targets. The at least another target comprises molybdenum and sodium species. The method further includes forming, using a sputtering process, a first precursor layer overlying the sodium bearing layer from at least another target including copper and/or gallium species and forming, using a sputtering process, a second precursor layer overlying the first precursor layer from at least another target including indium species. Furthermore, the method includes transferring the shaped substrate member including the first electrode layer, the sodium bearing layer, the first precursor layer, and the second precursor layer to a second chamber without breaking vacuum between the first chamber and the second chamber to maintain the copper and/or gallium layer and indium layer substantially free from moisture. The method further includes subjecting the shaped substrate member to a thermal treatment process in the second chamber within an environment comprising gas-phase selenium species and gas-phase sulfur species to form an absorber layer.

Many benefits can be achieved by applying the embodiments of the present invention. Particularly, sodium doping process serves an important step for forming high efficiency copper based chalcopyrite photovoltaic absorber layer. Embodiments of the present invention provides an efficient way using an in-chamber sputtering or other PVD deposition process to perform the sodium doping to maintain a well controlled sodium concentration in the absorber layer finally formed on an electrode layer on the shaped substrate member. The method, according to some embodiments, simplifies the doping process with optional interchangeable order to perform one or more sputtering processes to form one or more precursor layers and perform sodium doping for fabricating CIGS/CIS film. The in-chamber sodium doping can be performed in a same sputtering chamber (in different compartments) which can be easily configured within a large scale batch system. Certain advantage for in-chamber sodium doping also includes transferring the substrates with precursor layer to thermal treatment chamber without breaking the vacuum to avoid undesired absorption of moisture into the film. The thermal treatment chamber is also configured to handle multiple shaped substrates at the same time in vertical or horizontal directions with respect to gravity to reduce substantially thermal injury to the films and substrates during the treatment. Of course, there can be other variations, modifications, and alternatives.

These and other benefits may be described throughout the present specification and more particularly below.

BRIEF DESCRIPTION OF THE DRAWINGS

FIG. 3 is a simplified diagram illustrating a tubular shaped substrate being loaded in a chamber for fabricating thin film solar cell according to an embodiment of the present invention;

FIG. 4 is simplified diagram illustrating a tubular shaped substrate being loaded in a chamber for fabricating thin film solar cell according to an embodiment of the present invention and FIG. 4A is an enlarged view of a section of the substrate with an overlying electrode layer;

FIG. 5 is simplified diagram illustrating a tubular shaped substrate being loaded in a chamber for fabricating thin film solar cell according to an embodiment of the present invention and FIG. 5A is an enlarged view of a section of the substrate with an overlying precursor layer on the electrode layer;

FIG. 6 is simplified diagram illustrating a tubular shaped substrate being loaded in a chamber for fabricating thin film solar cell according to an embodiment of the present invention and FIG. 6A is an enlarged view of a section of the substrate with an overlying sodium bearing layer on the precursor layer;

FIG. 7 is simplified diagram illustrating a plurality of tubular shaped substrates being loaded in a chamber for a thermal selenization and sulfurization process according to an embodiment of the present invention;

DETAILED DESCRIPTION OF THE INVENTION

The present invention relates generally to photovoltaic techniques. More particularly, embodiments of the present invention provide a method and system for sodium doping in fabricating a copper indium diselenide species (CIS), copper indium gallium diselenide species (CIGS) based thin film photovoltaic cell, and/or others. The invention can be applied to various shaped cells including cylindrical/tubular photovoltaic modules, non-planar surfaces, flexible foils, plastics, building or window glass, roof tiles, automobiles, and other combinations.

Figure 1:
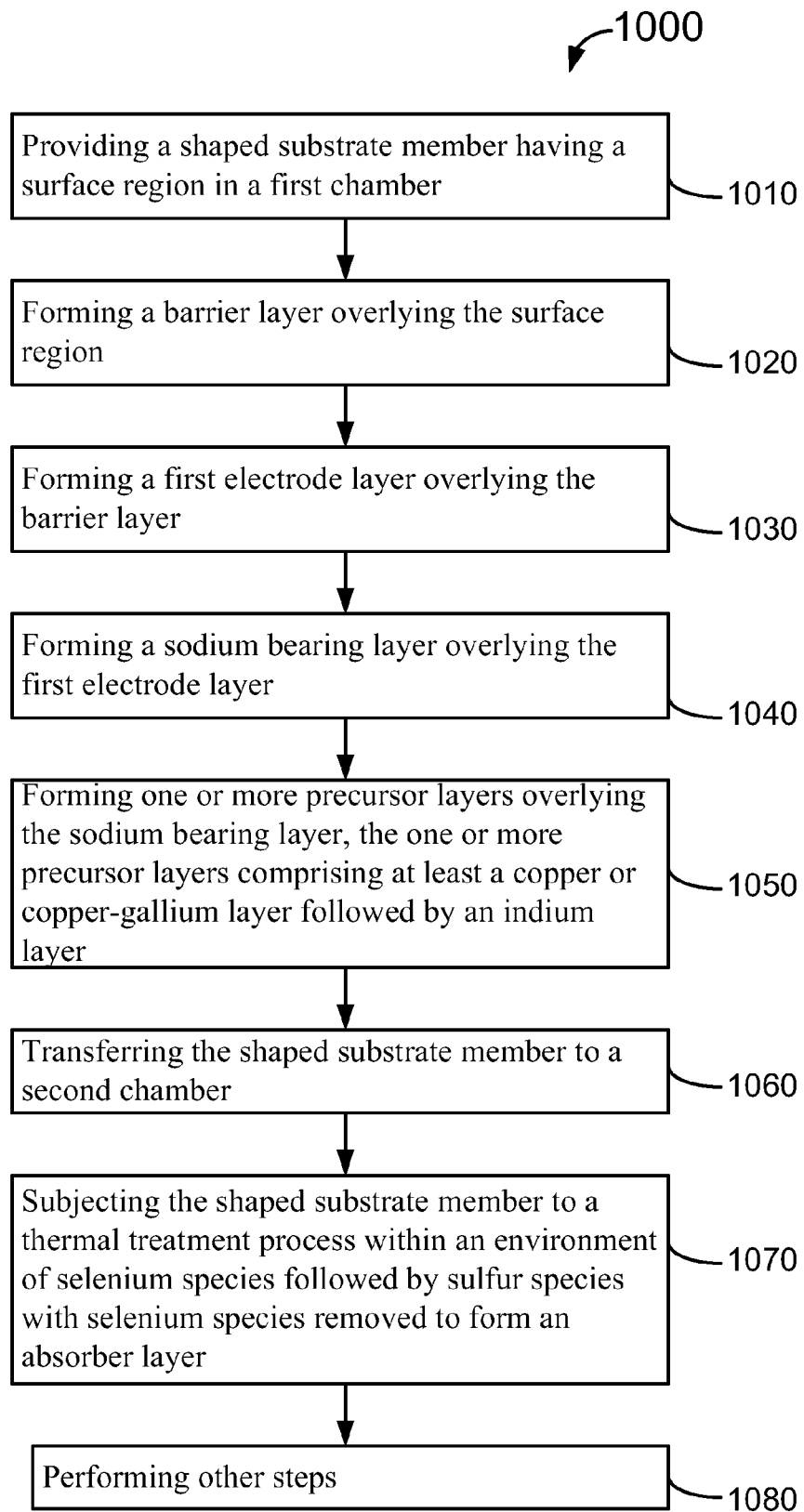
FIG. 1 is a simplified flowchart illustrating a method of sodium doping in fabricating a CIGS/CIS thin film photovoltaic cell on a shaped substrate according to an embodiment of the present invention.
Figure 2A:
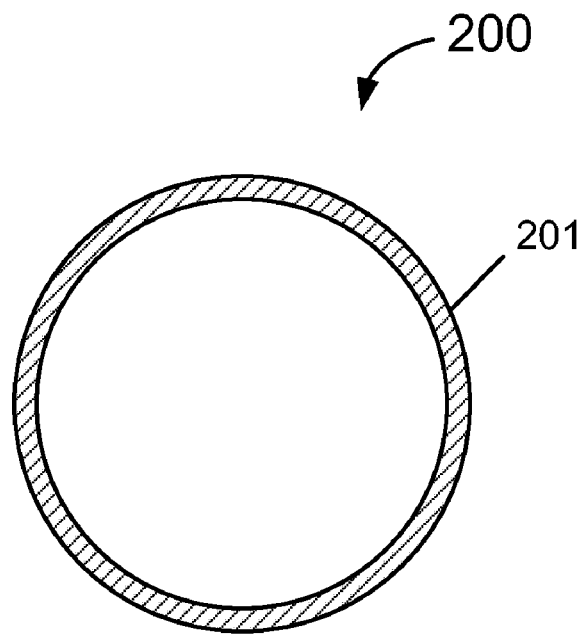
FIGS. 2A through 2D are simplified cross section views of a shaped substrate according to one or more embodiments of the present invention.
Figure 2B:
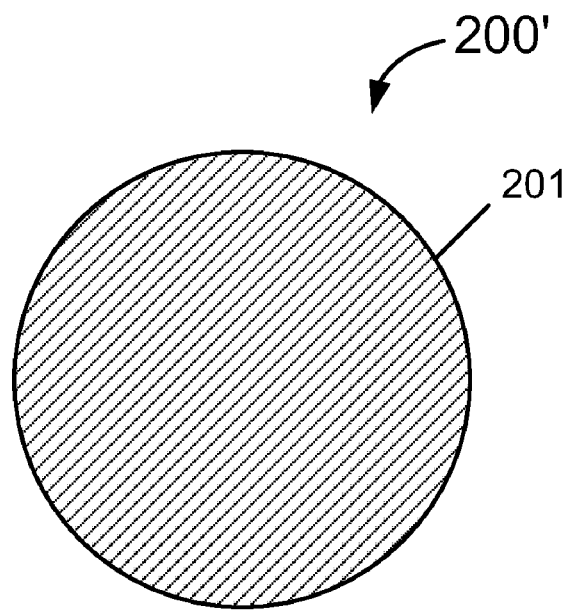
Figure 2C:
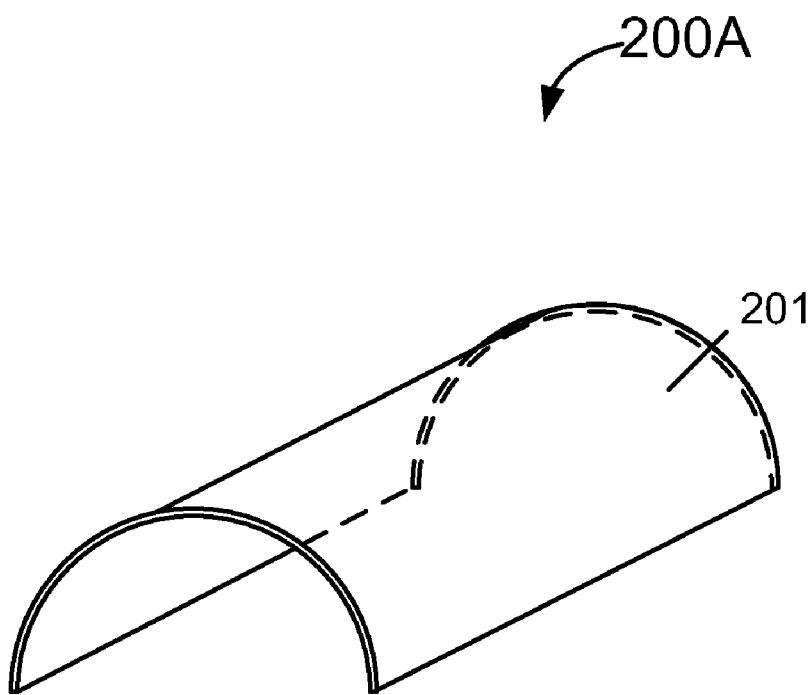
Figure 2D:
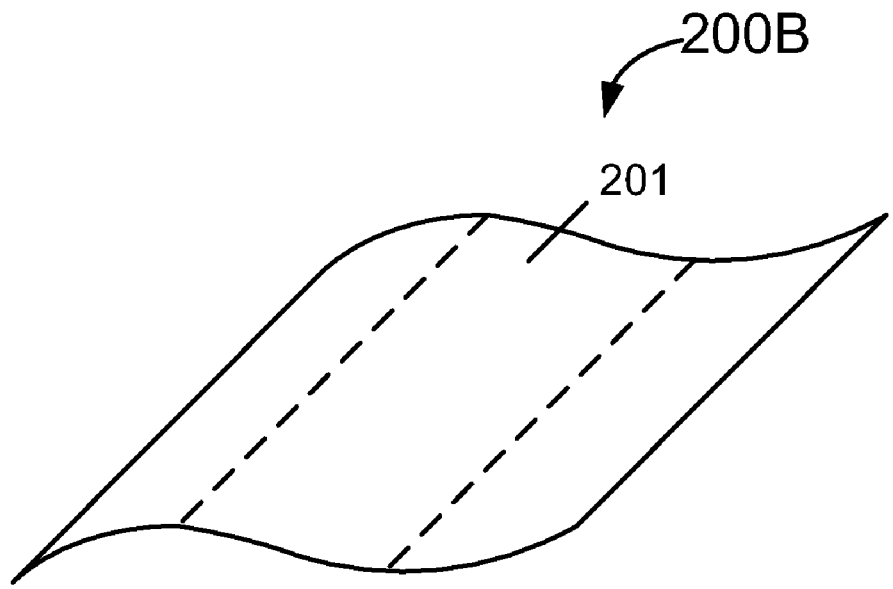

FIG. 1 is a simplified flowchart illustrating a method of fabricating a thin film photovoltaic cell including in-chamber sodium doping according to an embodiment of the present invention. This diagram is merely an example, which should not unduly limit the scope of the claims herein. The method 1000 includes the following processes:

1. Process 1010 for providing a shaped substrate member having a surface region in a first chamber;
2. Process 1020 for forming a barrier layer overlying the surface region;
3. Process 1030 for forming a first electrode layer overlying the barrier layer;
4. Process 1040 for forming a sodium bearing layer overlying the first electrode layer;
5. Process 1050 for forming one or more precursor layers on the sodium bearing layer, comprising at least a copper and/or copper-gallium layer followed by an indium layer;
6. Process 1060 for transferring the shaped substrate member to a second chamber;
7. Process 1070 for subjecting the shaped substrate member to a thermal treatment process within an environment comprising gas-phase selenium species followed by an environment of gas-phase sulfur species with selenium species being substantially removed to form an absorber layer;
8. Process 1080 for performing other steps.

The above sequence of processes provides a method of forming a Copper-Indium-Diselenide based chalcopyrite absorber layer in a thin film photovoltaic cell according to an embodiment of the present invention. In a specific embodiment, the method includes an in-chamber sodium doping process of forming a sodium bearing layer over and/or under or in-between one or more precursor layers before performing a thermal treatment selenization and sulfurization process. In another specific embodiment, the method also includes performing one or more sputtering processes in a same chamber with single or separate compartment for forming one or more layers including, for example, a barrier layer, an electrode layer, sodium bearing layer, one or more precursor layers. Other alternatives can also be provided where processes are added, one or more processes are removed, or one or more processes are provided in a different sequence without departing from the scope of the claims herein. For example, the sodium bearing layer can be performed using a salt spray process. In another example, a salt dipping process can be used for forming the sodium bearing layer overlying an electrode layer or a copper-gallium layer. Some processes mentioned above can be performed in a different order while other processes may be inserted in between. Further details of the method can be found throughout the present specification and more particularly below.

At Process 1010, a shaped substrate is provided. The shaped substrate can have a spatial form selected from a tube, a cylinder, a sphere, or other non-planar shaped tile, or a flexible foil, a sheet, or a plastic, or polymer and other combinations. The shaped substrate is transparent, and preferably a glass. For example, the shaped substrate is a soda lime glass, or a borosilicate glass, an acrylic glass, a specialty Corning™ glass, and others like a polymer or a plastic. Some examples of the shaped substrates 200, 200', 200A, 200B, are shown in FIGS. 2A through 2D. Each of the shaped substrate has a corresponding surface region 201. These diagrams are merely examples, which should not unduly limit the scope of the claims herein. One of ordinary skilled in the art should be able to recognize various variations, modifications, and alternatives. Process 1010 can be visually illustrated by FIG. 3 and further by the detailed description below.

FIG. 3 is a simplified diagram illustrating a tubular shaped substrate being loaded in a chamber for fabricating thin film solar cell according to an embodiment of the present invention. This diagram is merely an example, which should not unduly limit the scope of the claims herein. One of ordinary skill in the art would recognize many variations, alternatives, and modifications. As shown, a tubular shaped substrate 308 is loaded into a chamber 10. The chamber 10 is a vacuum chamber configured to perform multiple deposition processes and have various functions. In one example, chamber 10 has one or more targets 311, 313, 315, 317 etc. mounted according to specific manufacture batch system. Each of these targets (313 through 317) may be disposed in a separate compartment within the chamber 10. In an implementation, each of the one or more targets is associated with a sputtering process, or more generally, a physical vapor deposition (PVD) process, or simply an evaporation process to deposit one or multiple layers of specific materials therefrom. In case of the sputtering process, the material species of the target is deposited onto the shaped substrate if the latter is exposed under the corresponding target within the chamber 10. As shown in FIG. 3, the shaped substrate 308 is configured to be manipulated by a tool to allow its surface 301 being fully exposed to the target (for example target 311) through one or more mechanical motions. In an example, the mechanical motion is a rotation, illustrated by the arrow 320, for the tubular or cylindrical shaped substrate 308. In case the shaped substrate 308 possesses other spatial form such as sphere, or hemi-cylindrical tile, the corresponding mechanical motion 320 may be a 3D rotation, or a 2D rotation with 360 degrees, or axial rotation with 180 degrees or less. In case the shaped substrate 308 has other non-planar non-regular shape, the corresponding mechanical motion may be a deterring, a shifting, a shaking, etc. The mechanical motion associating with the shaped substrate for allowing full exposure of its surface region to the material flux from targets should be in effect within each compartment during each sputtering process or other type of PVD deposition/evaporation process.

In an embodiment, the shaped substrate 308 is made of a soda lime glass. The soda lime glass naturally contains alkaline ions (e.g., $Na^+$) which can provide a positive influence on the grain growth of thin film photovoltaic materials thereon. For example, polycrystalline semiconductor films of CuIn$(Ga)Se_2$ (CIGS) or $CuInSe_2$ (CIS) materials can be formed on soda lime glass substrates with coarse grain sizes of a few microns or larger so that high cell current can be collected with these photovoltaic films to have light-conversion efficiencies of 17% or above.

Referring to FIG. 1, the method 1000 includes Process 1020 to form a barrier layer overlying the surface region of the shaped substrate. This process can be at least partially illustrated in FIG. 4 and FIG. 4A. As shown, the barrier layer 306 can be formed over the surface region 301 of the shaped substrate 308. The formation process can be a sputtering process from target 311 or using other deposition process such as PVD, MOCVD, or evaporation. The barrier layer can be made from silicon oxide, silicon nitride, titanium nitride and others. Especially for substrate made by soda lime glass, the barrier layer can prevent un-controlled sodium species diffused into the film grown thereon. The barrier layer also serves adhesion enhancement function for the film formed on top of it overlying the surface region of the substrate. In an embodiment, the barrier layer can have a thickness of about 500 Angstroms, or 1000 Angstroms, or 1 μm, or 5 μm, and others. Of course, there can be other variations, modifications, and alternatives.

Referring again to FIG. 1, the method 1000 includes Process 1030 to form an electrode layer overlying the barrier layer. This process can be at least partially illustrated in FIG. 4 and FIG. 4A. As shown, the electrode layer can be formed using a sputtering process from a target 313 within the chamber 10. The chamber 10 can be installed multiple targets which can be interchangeable for depositing different material species separately and/or depositing several material species simultaneously. In an embodiment, the target 313 in association with the chamber 10 comprises desired metal material or conductive oxide material for forming the electrode layer. In a specific embodiment, the target 313 comprises molybdenum material and is used to deposit the electrode layer 304 overlying the barrier layer 306. In a specific embodiment, a sodium bearing layer may be added to follow the electrode layer formation. For example, over the formed electrode layer, a sodium bearing layer is deposited by sputtering from a Mo—Na compound target. In an embodiment, the molybdenum layer also can be pre-coated on the commercially available soda lime glass. Alternatively in a specific implementation, the electrode layer 304 is formed on a tubular shaped substrate 308 made by an uncoated and pre-washed soda lime glass using one or more deposition processes. The chamber 10 is a vacuum chamber configured to load one or more shaped substrates (each is similar to the substrate 308) to perform the one or more deposition processes. In a specific embodiment, the chamber 10 can be one part of a large scale batch system for manufacturing thin film solar cells.

The electrode layer 304 mentioned above functionally serves a lower or back electrode for a thin film photovoltaic cell formed thereafter on the substrate 308. In an example, the electrode layer 304, namely a first electrode layer, includes molybdenum material with a bi-layer structure (not explicitly shown in FIG. 4A). In particular, a first molybdenum layer is formed overlying the barrier layer 306 on the soda lime glass based shaped substrate 308 using a sputtering process at relative lower pressure of about 2 millitorr. The first (or lower) molybdenum layer is substantially under a tensile stress. Subsequently, a second (or upper) molybdenum layer is formed overlying the first molybdenum layer using a sputtering process at relative higher pressure of about 20 millitorr. The second molybdenum layer is substantially under a compressive stress and has a thickness of about 2000 Angstroms or about ten times thicker than the first molybdenum layer. Such bi-layer molybdenum structure with a desired strain field provides benefit of using a laser patterning process to form certain patterns substantially free of film cracking. In one embodiment, the laser patterning process can be one of a plurality of processes performed within the same batch system. As a result, the first electrode layer with a plurality of patterns suitable for corresponding interconnect structures can be prepared before subsequent processes of manufacturing thin film photovoltaic cells using large scale batch system.

Referring again to FIG. 1, the method 1000 further includes a process (Process 1040) of forming a sodium bearing layer overlying the electrode layer. This process can be illustrated by the FIG. 5 and FIG. 5A. As shown, the tubular shaped substrate now is exposed under target 315 which can contain sodium species uniformly distributed within a host material. In an embodiment, the sodium bearing layer 302 is formed by using a sputtering process from the sodium bearing target, e.g., the target 315. For tubular shaped substrate or other irregular shaped substrates, it is not very practical to have a loading configuration that one substrate has its sola lime glass surface facing the entire surface of another substrate subjecting to the sodium doping. Therefore, using in-chamber sputtering process to form the sodium bearing layer would be a preferred embodiment. In a specific embodiment, the sodium sputtering can be performed in a separated compartment of a same chamber (chamber 10). The substrate 308 with an overlying barrier layer 306 and an electrode layer 304 can be transferred from a first compartment in chamber 10 to a second compartment in chamber 10 without breaking vacuum condition but maintaining the sodium bearing layer 302 substantially free from moisture. Chamber 10 can be held in a high vacuum condition with a pressure set to be smaller than $10^{-3}$ microbar. Chamber 10 can be further supported by a cryogenic pump or a polycold system for attracting water vapor. The polycold system has an enclosed tube passing through the chamber with very cold fluid to allow cold tube surface to absorb moisture in the chamber, and further reduce the pressure. In anther specific embodiment, the sputtering process for sodium doping uses a sodium bearing target with a uniform composition of the sodium species distributed within the host material. Again, the shaped substrate 308 is configured to fully expose the electrode layer 304 to the target 313 for forming the sodium bearing layer 302. In an embodiment, the sodium bearing layer is characterized by a first amount of sodium species that is predetermined for fabricating an absorber layer. The first amount of sodium species at least partially contributes to the final sodium concentration of the absorber layer. Of course, depending on applications, there can be certain variations, modifications, and alternatives.

FIG. 1 also shows that the method 1000 includes a process (Process 1050) of forming one or more precursor layers overlying the sodium bearing layer. In an embodiment, the one or more precursor layers at least include a copper layer or a copper-gallium alloy layer, and an indium layer. In a specific embodiment, the process 1050 can be illustrated by FIG. 6 and FIG. 6A. As shown, as merely one example, the shaped substrate 308 with an overlying barrier layer 306 followed by the electrode layer 304 and overlying sodium bearing layer 302 is exposed to one or more targets from which one or more sputtering processes within the chamber 10 (or maybe in one specific compartment) can be performed to form the one or more precursor layers 301. These diagrams are merely examples, which should not unduly limit the scope of the claims herein. One of ordinary skill in the art would recognize many variations, alternatives, and modifications.

In an embodiment, a copper or a copper-gallium layer can be formed over the sodium bearing layer 302 by sputtering from a corresponding target (for example target 317) bearing copper or copper-gallium alloy species. In one or more embodiments, the copper or copper-gallium layer can be formed in a two or more stages, each stage representing one sublayer of Cu or Cu—Ga alloy. Between the sublayers, a sodium bearing layer with a second amount of sodium species can be inserted. In an embodiment, the sodium bearing target and the Cu—Ga target may be interchangeable to allow the sequential sputtering processes to perform within the same chamber.

In a specific embodiment, a DC magnetron sputtering process can be used to deposit the copper (or Cu—Ga) layer onto the first electrode layer under a following condition. The deposition pressure (using Ar gas) in the chamber 10 is controlled to be about 2-7 mTorr. Argon gas flow rate can set to grow the layer in a desired deposition rate. The full deposition time for sputter depositing a thin sodium bearing layer and a copper (or Cu—Ga) layer is about 30 seconds or less for about 170-180 nm in film thickness. The deposition temperature can be just at room temperature without need of intentionally heating the substrate. Of course, minor heating may be resulted due to the plasma generated during the deposition. During the deposition, the shaped substrate 308 is held at a temperature less than 200° C.

In an alternative embodiment, the thin layer of gallium-bearing material can be formed by sputtering a gallium-bearing target within an environment provided with argon gas. The sputtering process may use a power of about 120 Watts DC for about ten seconds and less according to a specific embodiment. The argon gas is provided at about a suitable flow rate. In a preferred embodiment, the deposition process is maintained in a vacuum environment, which is about 5 mTorr and less or about 1 mTorr to about 42 mTorr. In a specific embodiment, the gallium-bearing target material (e.g., Cu—Ga, or Ga—S target) is characterized by at least 10 to 25 atomic % and preferably about 15 atomic % of gallium concentration. Additionally, the deposition process can be performed under suitable temperatures such as about 50° C. to about 110° C. or at least less than 200° C. according to a specific embodiment. The copper-gallium target used for this sputtering process can be pre-selected to have a copper content richer than gallium content. For example, the copper content can be in a range from a determined amount of balance the gallium species or combination of other species.

Further, the process 1050 includes using sputtering deposition to form an indium layer overlying the copper layer or copper-gallium layer formed earlier. In an example, the indium layer can be formed using a sputtering process that is carried out in a same chamber 10 for performing other sputtering process (with the target 317 now being replaced by a target bearing pure indium species). In order to avoid or at least reduce mutual contamination and provide options for modify local sputtering environment, the sputtering process for depositing indium species can be performed in a separate compartment within the same chamber or interchange the suitable target within a controlled vacuum environment. In a specific embodiment, the indium layer is deposited over the copper layer or copper-gallium layer using a DC magnetron sputtering process under a similar condition. Due to different sputtering rate, the deposition time for the indium layer may be shorter than that for copper (and gallium) layer. For example, 50 to 70 seconds may be enough for depositing an indium layer of about 290 nm in thickness. In another specific embodiment, indium layer may be inserted between sublayers of Cu—Ga layer mentioned earlier. In one or more embodiments, an atomic ratio for copper species over group III species (gallium, indium, sulfur) species can be monitored during the formation of the one or more precursor layers. In a specific embodiment, the copper-to-group III species ratio is controlled to be substantially equal to but less than 1.0. This is aimed to have a desired copper:(gallium)indium atomic ratio in the final composition of the absorber layer so that a chalcopyrite CIGS/CIS film with desired grain structure can be formed.

In an example, the sodium bearing layer 302 is formed on top of the electrode layer 304 and under the precursor layers 301, as shown in FIG. 6A. In other embodiments, the sodium bearing layer can also be overlying the precursor layers or within the precursor layers or any combination of spatial locations. In an alternate implementation, the sputtering process for depositing indium species can be performed before the sputtering process for depositing copper layer. Then, the sodium bearing layer 302 is added overlying the indium layer, followed by a copper or copper-gallium layer. In this case, the sodium bearing layer 302 becomes part of or is embedded in the precursor layers 301. In general, a thin film structure including sodium bearing species embedded in the precursor layer can help to prevent or at least substantially reduce the chance for sodium species to absorb ambient humidity which may cause some reactive film damage or even delamination to the interface between the electrode layer 304, e.g., a molybdenum layer, and the precursor layers 301. In an embodiment, using sputtering process as an in-chamber sodium doping provides a well controlled stoichiometry for transforming the one or more precursor layers into a desired chalcopyrite structured CIGS/CIS absorber layer. Furthermore as another part of the two-stage process, a thermal selenization and sulfurization treatment is carried out for transforming the one or more precursor layers with proper amount of sodium species into an absorber layer for fabricating solar cells. More details can be found in the description below.

Subsequently, the method 1000 includes a process (Process 1060) of transferring the shaped substrate from the first chamber to a second chamber. In a specific embodiment, the process of transferring the plurality of the (substantially the same) shaped substrates should be ensured that the copper-indium based precursor layers on each substrate are not exposed to moisture with humidity higher than 10% RH. The first chamber 10, the second chamber 20, including some transferring tools, each can be configured independently or to be parts of a same large scale batch system. In an implementation, the first chamber 10 and the second chamber 20 are directly linked. In another implementation, the first chamber 10 and the second chamber are separated. In a specific embodiment, the plurality of the shaped substrates are loaded into the chamber 20 in a vertical direction with respect to gravity. In other implementation, the plurality of the shaped substrates can be loaded in horizontal direction with respect to the floor.

After transferring process, the method 1000 further includes a process (Process 1070) of subjecting the shaped substrate, including all the deposited films, to a thermal treatment process to transform the one or more precursor layers to a photovoltaic absorber layer with chalcopyrite structure. This process can be visually illustrated by FIG. 7. FIG. 7 is simplified diagram illustrating a plurality of tubular shaped substrates being loaded in a chamber for a thermal selenization and sulfurization process according to an embodiment of the present invention. This diagram is merely an example, which should not unduly limit the scope of the claims herein. One of ordinary skill in the art would recognize many variations, alternatives, and modifications. In an embodiment, the chamber 20 is a thermal diffusion furnace or a rapid temperature processor or a thermal annealing chamber with capability of controlling its chamber pressure, ramping and maintaining temperature, heating/cooling the substrate, supplying working gas and carrier gas and pumping out one or more gas species.

As shown in FIG. 7, a plurality of heating elements 25 are coupled to the chamber 20 from outside to supply thermal power to the inside of chamber 20 to heat the plurality of shaped substrates 700. The chamber 20 is coupled to a gas supply device 28 to introduce one or more working gas and carrier gas to establish a gaseous environment 27 at a controlled pressure and compositions. For example, the working gas in one process is hydrogen selenide or elemental selenium gas. In another process, the working gas may be hydrogen sulfide while selenium species being removed substantially. Also, one or more types of carrier gases such as nitrogen or other inert gases (argon or helium) are supplied to provide desired pressure and thermal uniformity through the whole volume of the chamber 20. The chamber 20 is coupled to a pumping system 29 to control the chamber pressure and selectively remove certain gas species when necessary. Mass spectroscopy tool may be used to monitor the composition of the gas species within the gaseous environment.

In a specific embodiment, the chamber 20 is configured to load a plurality of the tubular shaped substrates, e.g., the substrates 700, aligning their lengths in a vertical direction with respect to the gravity. In an implementation, the tubular shaped substrates numbered from 1 to N, where N is an integer greater than 2, is held by a substrate holder with a top fixer 22A and bottom support 22B. In an embodiment, the plurality of tubular shaped substrates comprises 4 or more individual substrates, each substrate 700 may be substantially the same as the structure 308 in a cylindrical tube form. In another embodiment, the plurality number N can be 40 or more for one chamber. Each substrate can have shapes selected from cylinder, sphere, tubular, semi-cylindrical tile, flexible foil, etc. For example, each substrate is a cylindrical tube having an OD ranging from 6 mm to 14 mm. But it is understood that other dimensions are possible. Each of the plurality substrates 700 is maintained by a holder in a configuration substantially free from warp, or stress, or damage. For example, if the substrates were provided in an orientation vertical with respect to gravity so that the gravitational force could not cause the substrates to sag and warp but to help them to be naturally relaxed or stabilized. When the chamber temperature increases, substrate material may reach a glass softening temperature, compromising the structural integrity of the substrate. Typically, glass substrates, particular soda lime glass substrates, begin to soften at 480° C. In an embodiment, the shaped substrates 700 are also separated from one another according to a predetermined spacing to ensure even heating and reactions with gaseous species that are to be introduced to the furnace. For cylindrical rod shaped substrates each with an OD of 10 mm, a typical rod-to-rod spacing should be at least 6 mm when the process chamber is fully loaded.

In a specific embodiment, the thermal treatment process 1070 is carried at a variable temperature environment capable ramping up from room temperature to about 450 Degree Celsius. The chamber 20 is configured to be a diffusion furnace capable of ramping up the temperature with a desired rate and control the temperature to a suitable range with an accuracy of about ± a few degrees. In one example, the chamber 20 is a custom designed rapid thermal processor. In another specific embodiment, the thermal treatment process 1070 is a thermal selenization process carried out in an environment comprising a gaseous selenium-bearing material. In one example, the gaseous selenium bearing material can be a gas-phase elemental selenium (or selenium vapor). In another example, hydrogen selenide $H_2Se$ gas is used. The thermal treatment is substantially a reactive annealing and diffusion process. Nitrogen gas is also added as a carrier gas for adjusting chamber pressure to about 600 Torr during the treatment for enhancing thermal uniformity within the diffusion furnace. In one implementation for large batch system, custom temperature profile needs to be obtained.

The thermal treatment process 1070 usually begins at room temperature with a certain composition of hydrogen selenide gas mixed with nitrogen gas provided into the diffusion furnace 30. The temperature is ramped up to about 400±10 Degrees Celsius at the same composition of gaseous environment, then the temperature is maintained there for a period of time of about 10 minutes to one hour. Then the selenium based working gas is pumped out to substantially remove selenium species in the chamber to stop the reactive process. Then the thermal treatment process continues as a sulfurization process as hydrogen sulfide $H_2S$ gas is added in as working gas before the temperature is further ramped up to about 500 degree Celsius or even higher. Optionally, nitrogen gas also is added as a carrier gas for keeping glass substrates at a substantially uniform temperature. Adding $H_2S$ gas can help to extract/replace certain amount of selenium species from the precursor layer to change band structure and optical profile of the photovoltaic absorber layer to create higher open circuit voltage.

Figure 8:
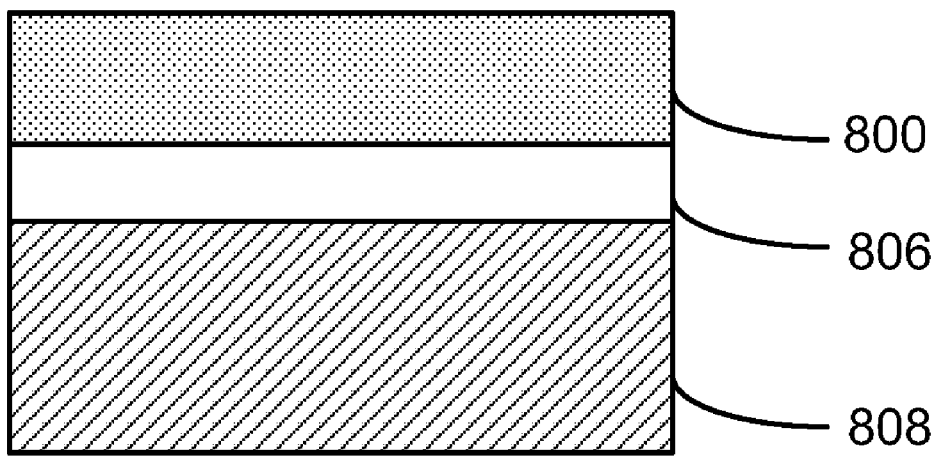
FIG. 8 is simplified diagram illustrating an enlarged section view of a shaped substrate including a CIGS/CIS film after a thermal selenization and sulfurization process according to an embodiment of the present invention.

As the result of the thermal treatment or thermal selenization and sulfurization process, a copper-indium(gallium)-diselenide CuIn(Ga)Se$_2$ (CIGS/CIS) film in chalcopyrite structure is formed from the one or more precursor layers deposited at the first stage of the two-stage process. In a specific embodiment, the first amount of sodium doped over the first electrode layer plus optionally the second amount of sodium deposited in between the one or more precursor layers are combined to contribute the thermal-induced reaction which leads to relative large CIGS/CIS chalcopyrite grains. FIG. 8 shows an enlarged section view of a shaped substrate including the chalcopyrite CIGS/CIS film after the thermal selenization and sulfurization process according to an embodiment of the present invention. This diagram is merely an example, which should not unduly limit the scope of the claims herein. One of ordinary skill in the art would recognize many variations, alternatives, and modifications. The formed CIGS/CIS film 800 as a photovoltaic absorber layer overlays the electrode layer 806 of the shaped substrate 808. Within the CIGS/CIS film, the atomic ratio of Cu-to-group III species is controlled to be slightly less than 1.0 and the sodium content is about $5 \times 10^{19}$ atom/cm$^3$ in order to achieve a desired structural property leading to high device performance as a photovoltaic absorber layer.

According to an embodiment of the present invention, the formation of CIGS/CIS chalcopyrite absorber layer 800 is carried out after performing the in-chamber sodium doping process. The sodium bearing layer 302 with a controlled amount plays a role in helping the growth of polycrystalline chalcopyrite structured grains in the formed precursor layer during the thermal treatment process 1070. In particular, the sodium species under a controlled concentration helps the chalcopyrite grains in film 800 to grow in relative large size up to a few microns. Without the assistance of sodium atoms or with non-controlled excessive supply of sodium content, the chalcopyrite grains in film 800 would become substantially finer, leading to a great reduction in photovoltaic current and degradation of the efficiency of the solar device. According to embodiments of the present invention, the sodium content can be well controlled by the in-chamber sodium doping process, which is simply a sputtering process using a sodium bearing target with a uniform composition of the sodium species distributed within a host material. In an embodiment, a preferred sodium concentration within the chalcopyrite CIGS/CIS photovoltaic absorber layer is about $5 \times 10^{19}$ atom/cm$^3$. In certain other embodiments, sodium doping can also be carried out by a salt spraying process or a salt dipping process. Of course, there are many alternatives, variations, and modifications for performing sodium doping for forming the chalcopyrite photovoltaic absorber layer.

In an alternative embodiment, the thermal treatment process 1070 can be also a sulfidation process alone where the chamber 20 is held in an environment with a fluidic-phase sulfur bearing species. For example, the sulfur bearing species can be provided in a solution, which has dissolved Na$_2$S, CS$_2$, (NH$_4$)$_2$S, thiosulfate, and others. In another example, the sulfur bearing species can be hydrogen sulfide in gas phase. As the result of these specific thermal treatment processes involving sulfide, a copper indium gallium disulfide film CuIn(Ga)S$_2$ or CuInS$_2$ also in chalcopyrite structure can be formed. In general, the thermal treatment process would cause reaction between the selenium/sulfur and the deposited composite film including copper, indium, gallium, and sodium. The reaction under a suitable condition at least leads to a formation of the film 800 that contains a plurality of chalcopyrite structured grains.

Figure 9:
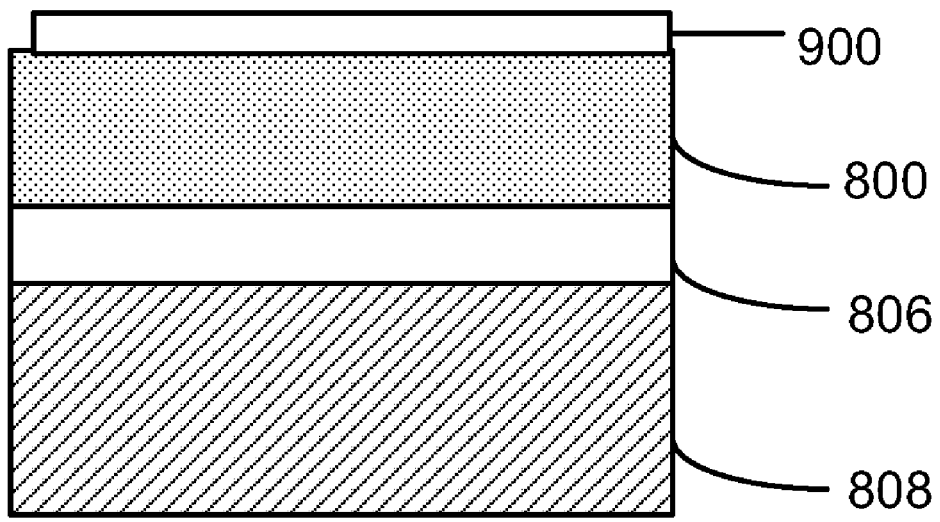
FIG. 9 is schematic diagram illustrating that additional layers are formed overlying the CIGS/CIS film and patterned for building a photovoltaic device according to certain embodiments of the present invention.

In certain other embodiments, the method 1000 can include one or more processes 1080 that are required for fabricating a thin film solar cells on the shaped substrate. For example, the method 1000 may include a process of forming a cadmium sulfide layer as a window layer 900 overlying the chalcopyrite photovoltaic absorber layer 800. FIG. 9 shows an example that additional layers are formed overlying the CIGS/CIS film and patterned for building a photovoltaic device according to certain embodiments of the present invention. The cadmium sulfide layer is characterized as a wide bandgap semiconductor for the thin film photovoltaic cells formed thereafter. In one example, the cadmium sulfide layer can be formed using sputtering, vacuum evaporation, or chemical bath deposition (CBD) techniques and doped with n$^+$-type impurities for conductivity. Depending on embodiments, the window layer 900 can be selected from a group materials consisting of a cadmium sulfide (CdS), a zinc sulfide (ZnS), zinc selenium (ZnSe), zinc oxide (ZnO), zinc magnesium oxide (ZnMgO), or others.

Additionally, an upper electrode layer, a second electrode layer, can be added overlying the window layer. The upper electrode layer typically is optically transparent. One widely used material for the upper electrode layer is transparent conductive oxide. For example, a zinc oxide film characterized with a resistivity of about $2 \times 10^{-3}$ Ohm-cm and less is used. In a specific embodiment, a first zinc oxide layer will be added overlying the window layer. In another specific embodiment, a second zinc oxide layer is inserted between the window layer and the first zinc oxide layer. In a specific embodiment, the second zinc oxide layer has a higher resistivity than the first zinc oxide layer. Functionally, the second zinc oxide layer plays more a role of barrier/protection layer while the first zinc oxide layer with lower resistivity plays more a role of conductive electrode layer. In certain embodiment, the zinc oxide layer is formed using a metalorganic chemical vapor deposition (MOCVD) technique within the same large scale batch system.

Furthermore, the method 1000 may include a process of maintaining the transparent substrate including the composite film to an environment substantially free from moisture. This process may be performed after the in-chamber sodium doping process and before the thermal treatment process. In an implementation, this process is performed after forming a copper and gallium layer and an indium layer in a first chamber but before transferring into a second chamber for performing sodium doping process. In another implementation, this process also is performed after the formation of copper based chalcopyrite photovoltaic absorber layer but before transferring into diffusion furnace. Due to the specific film composition including copper, gallium, indium, sodium species, exposing the film to moisture may cause serious damage to the grain structure of the film and eventually cause degradation of its photovoltaic efficiency. In one example, a work piece, e.g., the soda lime glass substrate with the overlying composition film or the just formed photovoltaic absorber layer or the absorber layer plus window layer, can be stored in a desicator with a humidity less than 10% RH. In another example, the work piece can be stored inside an aqueous solution.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of sodium doping in fabricating CIGS/CIS based thin film solar cells, the method comprising:
   providing a non-planar shaped substrate member, having a surface region, in a first chamber which includes at least one target, the shaped substrate member being configured through mechanical motions to allow the surface region to be exposed to the at least one target;
   forming a barrier layer over the surface region;
   forming a first electrode layer over the barrier layer;
   sputtering a sodium bearing layer over the first electrode layer, the sodium bearing layer including a first amount of a sodium species;
   forming a precursor layer over the sodium bearing layer, the precursor layer including at least a copper or copper-gallium layer followed by an indium layer, wherein a content ratio of copper/group III species being no larger than 1.0;
   loading the shaped substrate member into a second chamber; and
   subjecting the shaped substrate member to a thermal treatment process in the second chamber to an environment including a gas-phase selenium species followed by a gas-phase sulfur species with the selenium species being substantially removed, to form an absorber layer;
   wherein the gas-phase sulfur species comprises hydrogen sulfuride released into the second chamber after the selenium species is substantially removed from the second chamber before the temperature is further increased to about 500° C.

2. The method of claim 1 wherein the shaped substrate member comprises one of a glass, soda-lime glass, acrylic glass, a plastic, a flexible foil, or a polymer.

3. The method of claim 1 wherein the barrier layer comprises at least one of silicon oxide, silicon nitride, and titanium nitride of a thickness of about 500 Angstroms.

4. The method of claim 1 wherein the first electrode layer is a bi-layer structure of molybdenum comprising a tensile stressed under layer overlying the barrier layer and a compressive stressed upper layer.

5. The method of claim 1 wherein the step of forming the first electrode layer comprises sputtering, physical vapor deposition, or vacuum evaporation.

6. The method of claim 5 wherein the at least one target comprises a molybdenum species.

7. The method of claim 5 wherein the shaped substrate member is rotated to allow the surface region to be exposed to the at least one target.

8. The method for claim 1 wherein the step of forming the precursor layer comprises sputtering, physical vapor deposition, or evaporation, in association with a copper target or a copper-gallium alloy target and a substantially pure indium target.

9. The method of claim 8 wherein the precursor layer comprises a multilayered structure having a series of copper-layer/indium-layer combinations formed by sequentially sputtering the copper target and the indium target.

10. The method of claim 8 wherein the precursor layer comprises at least a copper-gallium alloy layer and an indium layer abutting a sodium bearing layer having a second amount of sodium species.

11. The method of claim 8 wherein the shaped substrate member is kept at a temperature less than 200° C. when forming the precursor layer.

12. The method of claim 1 wherein the step of forming the sodium bearing layer comprises using a sputtering process with a sodium bearing target having a uniform composition of a sodium species distributed within a host material.

13. The method of claim 1 wherein the step of forming the sodium-bearing layer is carried out in a separated compartment within the first chamber.

14. The method of claim 1 wherein the first chamber comprises a vacuum with a pressure set to be lower than $10^{-3}$ microbar, supported by a cryogenic pump or polycold system for attracting water vapor.

15. The method of claim 1 wherein the second chamber is configured to load the shaped substrate member in a vertical direction with respect to the gravity.

16. The method of claim 1 wherein the gas-phase selenium species comprises hydrogen selenide or elemental selenium gas released into the second chamber before the temperature is raised to above about 450° C. for a predetermined period of time.

17. The method of claim 1 wherein the absorber layer comprises chalcopyrite CIS/CIGS film having an average sodium atomic density of about $5 \times 10^{19}$ atoms/cm$^3$ throughout the absorber layer after thermal treatment of the precursor layer.

18. The method of claim 1 further comprising forming a n-type transparent semiconductor layer overlying the absorber layer, followed by forming a second electrode layer.

19. The method of claim 17 wherein the second electrode layer comprises zinc oxide formed by MOCVD.

20. A method of sodium doping in fabricating CIGS/CIS based thin film solar cells, the method comprising:
   providing a shaped substrate member, having a surface region, in a first chamber having at least one target, configured through mechanical motion to allow the surface region to be exposed to the target;
   forming a barrier layer over the surface region;
   sputtering a first electrode layer including molybdenum over the barrier layer;
   sputtering a sodium bearing layer over the first electrode layer from a target which includes molybdenum and a sodium species;
   sputtering a first precursor layer over the sodium bearing layer from a target including copper and/or a gallium species;
   sputtering a second precursor layer over the first precursor layer from another target including an indium species;
   transferring the shaped substrate member including the first electrode layer, the sodium bearing layer, the first precursor layer, and the second precursor layer to a second chamber without breaking vacuum between the first chamber and the second chamber to maintain the copper and/or gallium layer and indium layer substantially free from moisture; and
   subjecting the shaped substrate member to a thermal treatment process in the second chamber within an environment comprising gas-phase selenium species and gas-phase sulfur species to form an absorber layer;
   wherein the thermal treatment process comprises a step of removing gas-phase selenium species replaced with a hydrogen sulfide gas in the second chamber before the temperature being ramped up to about 500° C.

21. The method of claim 20 further comprising transferring the shaped substrate member to an environment comprising dry air or dry nitrogen.

22. The method of claim 20 wherein the shaped substrate member comprises one of a glass, soda-lime glass, acrylic glass, a plastic, a flexible foil, or a polymer.

23. The method of claim 20 wherein the first electrode layer comprises a bi-layer molybdenum material.

24. The method of claim 20 wherein the mechanical motions comprises rotation, shift, twist, or shaking.

25. The method of claim 20 further comprising depositing a sodium species after forming the first precursor layer by using an in-chamber sputtering process.

26. The method of claim 20 wherein the sputtering process for forming the first precursor layer or the second precursor layer is performed under a temperature less than 200° C.

27. The method of claim 20 wherein the thermal process is performed with a pressure of about 600 torr in the environment of the gas-phase selenium species and a temperature of about 450° C.

28. The method of claim 20 wherein the absorber layer comprises chalcopyrite CIS/CIGS film having an average sodium concentration of about $5 \times 10^{19}$ atoms/cm$^3$ after a thermal treatment process.

29. The method of claim 20 wherein the thermal treatment process comprises using nitrogen gas, argon gas, or helium gas as a carrier gas in the second chamber.

* * * * *